(12) United States Patent
Jeon et al.

(10) Patent No.: US 9,905,289 B1
(45) Date of Patent: Feb. 27, 2018

(54) METHOD AND SYSTEM FOR SYSTEMATIC READ RETRY FLOW IN SOLID STATE MEMORY

(71) Applicant: EMC IP Holding Company LLC, Hopkinton, MA (US)

(72) Inventors: Seungjune Jeon, Santa Clara, CA (US); Haleh Tabrizi, San Francisco, CA (US)

(73) Assignee: EMC IP Holding Company LLC, Hopkinton, MA (US)

(*) Notice: Subject to any disclaimer, the term of this patent is extended or adjusted under 35 U.S.C. 154(b) by 0 days.

(21) Appl. No.: 15/581,101

(22) Filed: Apr. 28, 2017

(51) Int. Cl.
  *G11C 16/04* (2006.01)
  *G11C 11/4096* (2006.01)
  *G11C 11/408* (2006.01)
  *G11C 11/56* (2006.01)
  *G06F 11/10* (2006.01)
  *G11C 29/52* (2006.01)

(52) U.S. Cl.
  CPC ...... *G11C 11/4096* (2013.01); *G11C 11/4087* (2013.01); *G06F 11/1072* (2013.01); *G11C 11/5621* (2013.01); *G11C 29/52* (2013.01)

(58) Field of Classification Search
  CPC . G11C 11/4096; G11C 11/4087; G11C 29/52; G11C 11/5621; G06F 11/1072
  USPC ............ 365/185.17–185.18, 185.23, 185.33, 365/189.15, 189.14
  See application file for complete search history.

(56) References Cited

U.S. PATENT DOCUMENTS 9,478,292 B2 * 10/2016 Sun .................. G11C 16/10
2013/0031430 A1   1/2013 Eran

* cited by examiner

*Primary Examiner* — David Lam
(74) *Attorney, Agent, or Firm* — Chamberlain Hrdlicka

(57) ABSTRACT

In general, embodiments of the technology relate to improving read performance of solid-state storage by using decoding parameters deemed particularly suitable for the read operation that is currently being performed. More specifically, embodiments of the technology relate to using different decoding parameters when a read operation needs to be repeated because the initial read operation has failed.

20 Claims, 12 Drawing Sheets

| Retry Count | Read Threshold Shifts | | Decoding Mode |
|---|---|---|---|
| | Lower Page - AR | Lower Page ER | |
| 0 | 0 | 0 | 0 |
| 1 | +4 | +1 | 0 |
| 2 | +8 | -3 | 0 |
| 3 | +2 | -1 | 1 |
| 4 | +4 | -5 | 1 |
| 5 | +10 | +2 | 2 |
| ... | ... | ... | ... |
| r_max | ... | ... | ... |

FIG. 6A

| Retry Count | Read Threshold Shifts | | | Decoding Mode |
|---|---|---|---|---|
| | Middle Page - BR | Middle Page - DR | Middle Page - FR | |
| 0 | +4 | +1 | -8 | 0 |
| 1 | +8 | -3 | +5 | 0 |
| 2 | +2 | -1 | -4 | 1 |
| 3 | +4 | -5 | +1 | 1 |
| 4 | +10 | +2 | -1 | 2 |
| 5 | -2 | -7 | -3 | 2 |
| ... | ... | ... | ... | ... |
| r_max | ... | ... | ... | ... |

FIG. 6B

| Retry Count | Read Threshold Shifts | | Decoding Mode |
|---|---|---|---|
| | Upper Page - CR | Upper Page GR | |
| ... | ... | ... | ... |
| r_max | ... | ... | ... |

FIG. 6C

| Page Type | Decoding Mode | Extra Read | | | | | | | | Decoding Parameter | | | | | |
|---|---|---|---|---|---|---|---|---|---|---|---|---|---|---|---|
| | | \multicolumn{4}{c}{AR} | | | | \multicolumn{4}{c}{ER} | | | | | | |
| | | R0 | R1 | R2 | R3 | R4 | R5 | R6 | R7 | L0 | L1 | L2 | L3 | L4 | L5 |
| Lower | 0 | NA | NA | NA | NA | NA | NA | NA | NA | -8 | +9 | NA | NA | NA | NA |
| Lower | 1 | -7 | +8 | NA | NA | -6 | +7 | NA | NA | -14 | -3 | +5 | +12 | NA | NA |
| Lower | 2 | -6 | +7 | NA | NA | -8 | +8 | NA | NA | -14 | -5 | +6 | +13 | NA | NA |
| Lower | 3 | -12 | -6 | +5 | +11 | -13 | -5 | +6 | +12 | -15 | -8 | -4 | +3 | +7 | +15 |
| ... | | | | | | | | | | | | | | | |

FIG. 6D

METHOD AND SYSTEM FOR SYSTEMATIC READ RETRY FLOW IN SOLID STATE MEMORY

BACKGROUND

One important performance metric for a storage system is the read performance, including the latency and error rate related to retrieving data stored in the storage system. Read performance may be affected by read retries that may be necessary if an initial read operation was unsuccessful.

BRIEF DESCRIPTION OF DRAWINGS

FIG. 6A shows an exemplary primary read retry table for a lower page of TLC solid state memory.

FIG. 6B shows an exemplary primary read retry table for a middle page of TLC solid state memory.

FIG. 6C shows an exemplary primary read retry table for an upper page of TLC solid state memory.

FIG. 6D shows an exemplary secondary table for the systematic read retry of a lower page of TLC solid state memory.

DETAILED DESCRIPTION

Specific embodiments of the technology will now be described in detail with reference to the accompanying figures. In the following detailed description of embodiments of the technology, numerous specific details are set forth in order to provide a more thorough understanding of the technology. However, it will be apparent to one of ordinary skill in the art that the technology may be practiced without these specific details. In other instances, well-known features have not been described in detail to avoid unnecessarily complicating the description In the following description of FIGS. 1-8, any component described with regard to a figure, in various embodiments of the technology, may be equivalent to one or more like-named components described with regard to any other figure. For brevity, descriptions of these components will not be repeated with regard to each figure. Thus, each and every embodiment of the components of each figure is incorporated by reference and assumed to be optionally present within every other figure having one or more like-named components. Additionally, in accordance with various embodiments of the technology, any description of the components of a figure is to be interpreted as an optional embodiment which may be implemented in addition to, in conjunction with, or in place of the embodiments described with regard to a corresponding like-named component in any other figure.

In general, embodiments of the technology relate to improving read performance of solid-state storage by using decoding parameters deemed particularly suitable for the read operation that is currently being performed. More specifically, embodiments of the technology relate to using different decoding parameters when a read operation needs to be repeated because the initial read operation has failed. A read failure may occur, for example, if errors in the data obtained from memory cells of the solid state memory do not allow a decoding algorithm (e.g., an error correcting code (ECC) algorithm) to successfully reconstruct the data. While an ECC algorithm may, for example, successfully perform a reconstruction if there are only a few or no errors in the data obtained from the memory cells, with an increasing number of errors, such reconstruction may no longer be possible. In one embodiment of the technology, the read operation is therefore repeated using decoding parameters that are deemed more suitable for successfully reading and decoding the data. The updated parameters may include, for example, a different set of read thresholds and/or instructions for using a different type of decoding algorithm, as described in detail below. Read operations may be repeatedly executed with different decoding parameters until either the read operation is successfully completed or a maximum number of read operations has been performed.

The following description describes one or more systems and methods for implementing one or more embodiments of the technology.

Figure 1A:
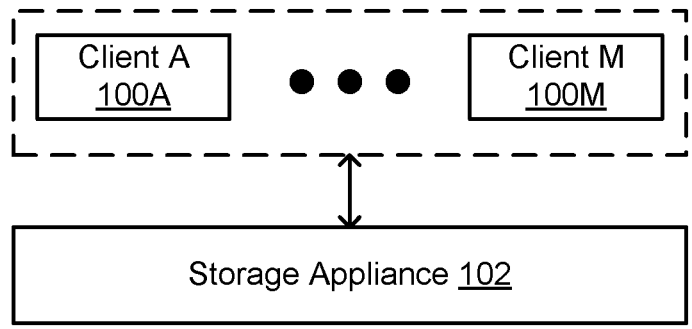
FIGS. 1A-1C show systems in accordance with one or more embodiments of the technology.
Figure 1B:
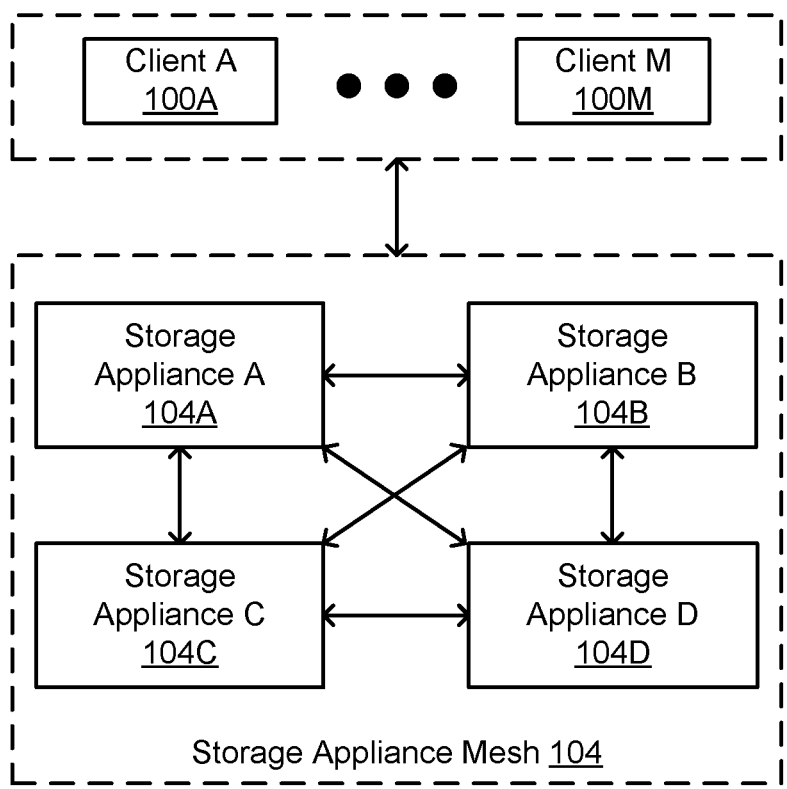
Figure 1C:
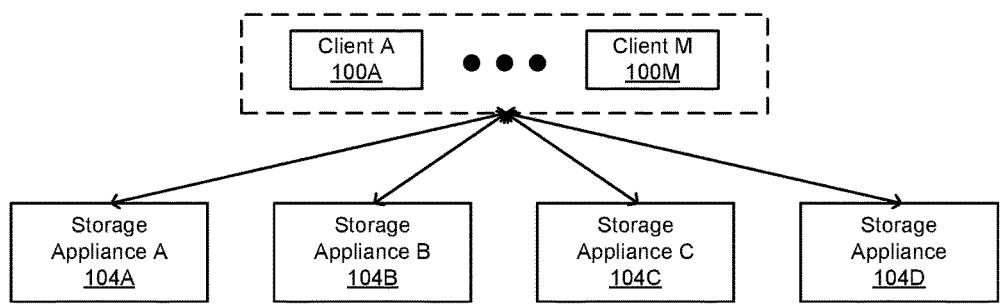

FIGS. 1A-1C show systems in accordance with one or more embodiments of the technology. Referring to FIG. 1A, the system includes one or more clients (client A (100A), client M (100M)) operatively connected to a storage appliance (102).

In one embodiment of the technology, clients (100A, 100M) correspond to any physical system that includes functionality to issue a read request to the storage appliance (102) and/or issue a write request to the storage appliance (102). Though not shown in FIG. 1A, each of the clients (100A, 100M) may include a client processor (not shown), client memory (not shown), and any other software and/or hardware necessary to implement one or more embodiments of the technology.

In one embodiment of the technology, the client (100A-100M) is configured to execute an operating system (OS) that includes a file system. The file system provides a mechanism for the storage and retrieval of files from the storage appliance (102). More specifically, the file system includes functionality to perform the necessary actions to issue read requests and write requests to the storage appliance. The file system also provides programming interfaces to enable the creation and deletion of files, reading and writing of files, performing seeks within a file, creating and deleting directories, managing directory contents, etc. In addition, the file system also provides management interfaces to create and delete file systems. In one embodiment of the technology, to access a file, the operating system (via the file system) typically provides file manipulation interfaces to open, close, read, and write the data within each file and/or to manipulate the corresponding metadata.

Continuing with the discussion of FIG. 1A, in one embodiment of the technology, the clients (100A, 100M) are configured to communicate with the storage appliance (102)

using one or more of the following protocols: Peripheral Component Interconnect (PCI), PCI-Express (PCIe), PCI-eXtended (PCI-X), Non-Volatile Memory Express (NVMe), Non-Volatile Memory Express (NVMe) over a PCI-Express fabric, Non-Volatile Memory Express (NVMe) over an Ethernet fabric, and Non-Volatile Memory Express (NVMe) over an Infiniband fabric. Those skilled in the art will appreciate that the technology is not limited to the aforementioned protocols.

In one embodiment of the technology, the storage appliance (102) is a system that includes volatile and persistent storage and is configured to service read requests and/or write requests from one or more clients (100A, 100M). Various embodiments of the storage appliance (102) are described below in FIG. 2.

Referring to FIG. 1B, FIG. 1B shows a system in which clients (100A, 100M) are connected to multiple storage appliances (104A, 104B, 104C, 104D) arranged in a mesh configuration (denoted as storage appliance mesh (104) in FIG. 1B). As shown in FIG. 1B, the storage appliance mesh (104) is shown in a fully-connected mesh configuration—that is, every storage appliance (104A, 104B, 104C, 104D) in the storage appliance mesh (104) is directly connected to every other storage appliance (104A, 104B, 104C, 104D) in the storage appliance mesh (104). In one embodiment of the technology, each of the clients (100A, 100M) may be directly connected to one or more storage appliances (104A, 104B, 104C, 104D) in the storage appliance mesh (104). Those skilled in the art will appreciate that the storage appliance mesh may be implemented using other mesh configurations (e.g., partially connected mesh) without departing from the technology.

Referring to FIG. 1C, FIG. 1C shows a system in which clients (100A, 100M) are connected to multiple storage appliances (104A, 104B, 104C, 104D) arranged in a fan-out configuration. In this configuration, each client (100A, 100M) is connected to one or more of the storage appliances (104A, 104B, 104C, 104D); however, there is no communication between the individual storage appliances (104A, 104B, 104C, 104D).

Those skilled in the art will appreciate that while FIGS. 1A-1C show storage appliances connected to a limited number of clients, the storage appliances may be connected to any number of clients without departing from the technology. Those skilled in the art will appreciate that while FIGS. 1A-1C show various system configurations, the technology is not limited to the aforementioned system configurations. Further, those skilled in the art will appreciate that the clients (regardless of the configuration of the system) may be connected to the storage appliance(s) using any other physical connection without departing from the technology.

Figure 2:
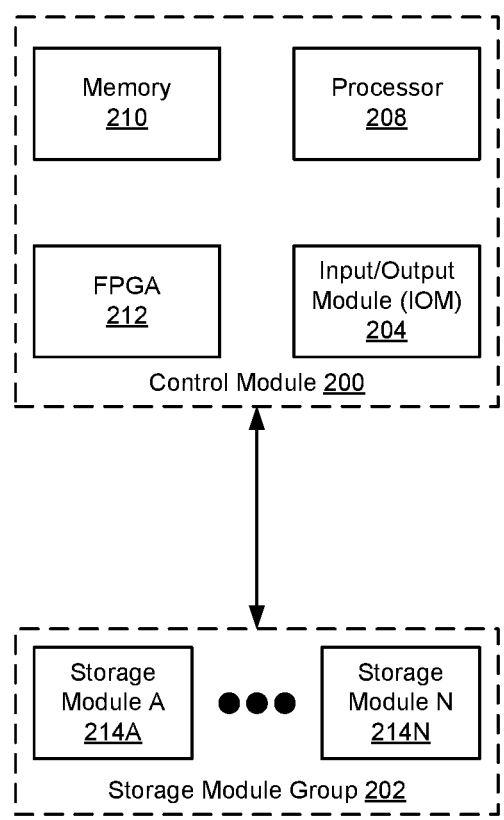
FIG. 2 shows storage appliances in accordance with one or more embodiments of the technology.

FIG. 2 shows embodiments of a storage appliance in accordance with one or more embodiments of the technology. The storage appliance includes a control module (200) and a storage module group (202). Each of these components is described below. In general, the control module (200) is configured to manage the servicing of read and write requests from one or more clients. In particular, the control module is configured to receive requests from one or more clients via the input/output module (IOM, 204, discussed below), to process the request (which may include sending the request to the storage module), and to provide a response to the client after the request has been serviced. Additional details about the components in the control module are included below. Further, the operation of the control module with respect to servicing read requests is described below with reference to FIGS. 7A and 7B.

Continuing with the discussion of FIG. 2, in one embodiment of the technology, the control module (200) includes an Input/Output Module (IOM) (204), a processor (208), a memory (210), and, optionally, a Field Programmable Gate Array (FPGA) (212). In one embodiment of the technology, the IOM (204) is the physical interface between the clients (e.g., 100A, 100M in FIGS. 1A-1C) and the other components in the storage appliance. The IOM supports one or more of the following protocols: PCI, PCIe, PCI-X, Ethernet (including, but not limited to, the various standards defined under the IEEE 802.3a-802.3bj), Infiniband, and Remote Direct Memory Access (RDMA) over Converged Ethernet (RoCE). Those skilled in the art will appreciate that the IOM may be implemented using protocols other than those listed above without departing from the technology.

Continuing with FIG. 2, the processor (208) is a group of electronic circuits with a single core or multi-cores that are configured to execute instructions. In one embodiment of the technology, the processor (208) may be implemented using a Complex Instruction Set (CISC) Architecture or a Reduced Instruction Set (RISC) Architecture. In one or more embodiments of the technology, the processor (208) includes a root complex (as defined by the PCIe protocol). In one embodiment of the technology, if the control module (200) includes a root complex (which may be integrated into the processor (208)) then the memory (210) is connected to the processor (208) via the root complex. Alternatively, the memory (210) is directly connected to the processor (208) using another point-to-point connection mechanism. In one embodiment of the technology, the memory (210) corresponds to any volatile memory including, but not limited to, Dynamic Random-Access Memory (DRAM), Synchronous DRAM, SDR SDRAM, and DDR SDRAM.

In one embodiment of the technology, the processor (208) is configured to create and update an in-memory data structure (not shown), where the in-memory data structure is stored in the memory (210). In one embodiment of the technology, the in-memory data structure includes information described in FIG. 4.

In one embodiment of the technology, the processor is configured to offload various types of processing to the FPGA (212). In one embodiment of the technology, the FPGA (212) includes functionality to calculate checksums for data that is being written to the storage module(s) and/or data that is being read from the storage module(s). Further, the FPGA (212) may include functionality to calculate P and/or Q parity information for purposes of storing data in the storage module(s) using a RAID scheme (e.g., RAID 2-RAID 6) and/or functionality to perform various calculations necessary to recover corrupted data stored using a RAID scheme (e.g., RAID 2-RAID 6). In one embodiment of the technology, the storage module group (202) includes one or more storage modules (214A, 214N) each configured to store data. One embodiment of a storage module is described below in FIG. 3.

Figure 3:
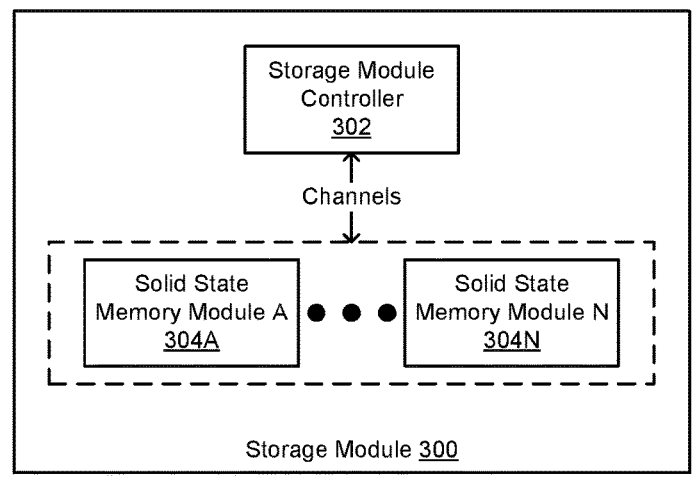
FIG. 3 shows a storage module in accordance with one or more embodiments of the technology.

FIG. 3 shows a storage module in accordance with one or more embodiments of the technology. The storage module (300) includes a storage module controller (302), memory (not shown), and one or more solid-state memory modules (304A, 304N). Each of these components is described below.

In one embodiment of the technology, the storage module controller (300) is configured to receive requests to read from and/or write data to one or more control modules. Further, the storage module controller (300) is configured to service the read and write requests using the memory (not shown) and/or the solid-state memory modules (304A, 304N).

In one embodiment of the technology, the memory (not shown) corresponds to any volatile memory including, but not limited to, Dynamic Random-Access Memory (DRAM), Synchronous DRAM, SDR SDRAM, and DDR SDRAM.

In one embodiment of the technology, the solid-state memory modules correspond to any data storage device that uses solid-state memory to store persistent data. In one embodiment of the technology, solid-state memory may include, but is not limited to, NAND Flash memory and NOR Flash memory. Further, the NAND Flash memory and the NOR flash memory may include single-level cells (SLCs), multi-level cell (MLCs), or triple-level cells (TLCs). Those skilled in the art will appreciate that embodiments of the technology are not limited to storage class memory.

Figure 4:
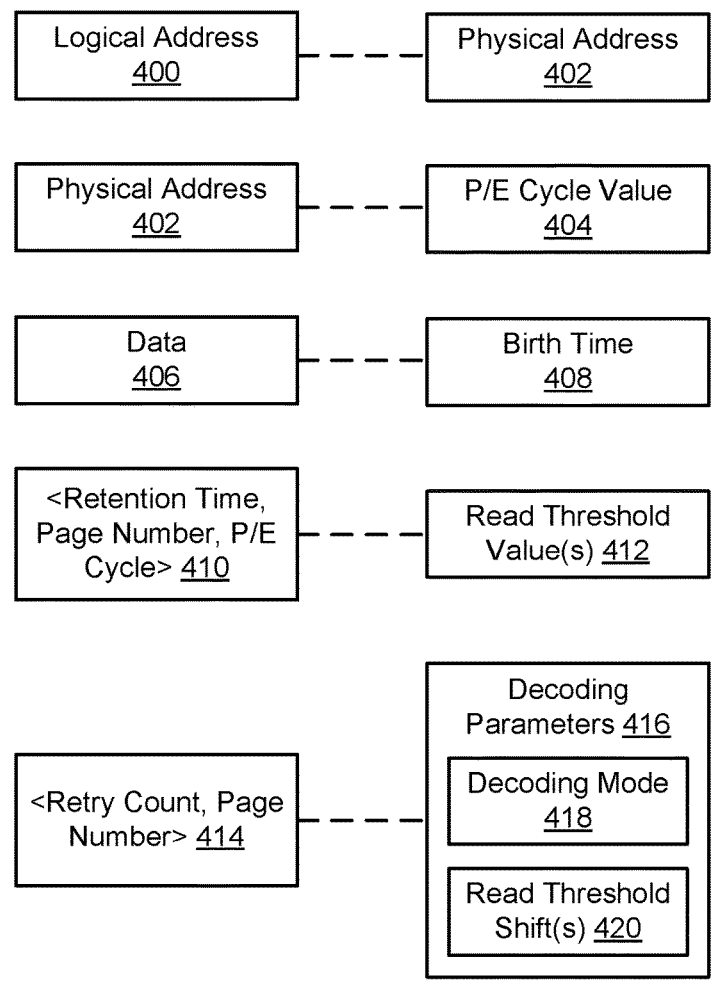
FIG. 4 shows the relationship between various components in accordance with one or more embodiments of the technology.

FIG. 4 shows the relationship between various components in accordance with one or more embodiments of the technology. More specifically, FIG. 4 shows the various types of information that is stored in the memory of the control module. Further, the control module includes functionality to update the information stored in the memory of the control module. The information described below may be stored in one or more in-memory data structures. Further, any data structure type (e.g., arrays, linked lists, hash tables, etc.) may be used to organize the following information within the in-memory data structure(s) provided that the data structure type(s) maintains the relationships (as described below) between the information.

The memory includes a mapping of logical addresses (400) to physical addresses (402). In one embodiment of the technology, the logical address (400) is an address at which the data appears to reside from the perspective of the client (e.g., 100A, 100M in FIG. 1A). Said another way, the logical address (400) corresponds to the address that is used by the file system on the client when issuing a read request to the storage appliance.

In one embodiment of the technology, the logical address is (or includes) a hash value generated by applying a hash function (e.g., SHA-1, MD-5, etc.) to an n-tuple, where the n-tuple is <object ID, offset ID>. In one embodiment of the technology, the object ID defines a file and the offset ID defines a location relative to the starting address of the file. In another embodiment of the technology, the n-tuple is <object ID, offset ID, birth time>, where the birth time corresponds to the time when the file (identified using the object ID) was created. Alternatively, the logical address may include a logical object ID and a logical byte address, or a logical object ID and a logical address offset. In another embodiment of the technology, the logical address includes an object ID and an offset ID. Those skilled in the art will appreciate that multiple logical addresses may be mapped to a single physical address and that the logical address content and/or format is not limited to the above embodiments.

In one embodiment of the technology, the physical address (402) corresponds to a physical location in a solid-state memory module (304A, 304N) in FIG. 3. In one embodiment of the technology, the physical address is defined as the following n-tuple: <storage module, channel, chip enable, LUN, plane, block, page number, byte>.

In one embodiment of the technology, each physical address (402) is associated with a program/erase (P/E) cycle value (404). The P/E cycle value may represent: (i) the number of P/E cycles that have been performed on the physical location defined by the physical address or (ii) a P/E cycle range (e.g., 5,000-9,999 P/E cycles), where the number of P/E cycles that have been performed on the physical location defined by the physical address is within the P/E cycle range. In one embodiment of the technology, a P/E cycle is the writing of data to one or more pages in an erase block (i.e., the smallest addressable unit for erase operations, typically, a set of multiple pages) and the erasure of that block, in either order.

The P/E cycle values may be stored on a per page basis, a per block basis, on a per set of blocks basis, and/or at any other level of granularity. The control module includes functionality to update, as appropriate, the P/E cycle values (402) when data is written to (and/or erased from) the solid-state storage modules.

In one embodiment of the technology, all data (i.e., data that the file system on the client has requested be written to solid-state storage modules) (406) is associated with a birth time (408). The birth time (408) may correspond to: (i) the time the data is written to a physical location in a solid-state storage module (as a result of client write request, as a result of a garbage collection operation initiated by the control module, etc.); (ii) the time that the client issued a write request to write the data to a solid-state storage module; or (iii) a unitless value (e.g., a sequence number) that corresponds to the write events in (i) or (ii).

In one embodiment of the technology, the in-memory data structure includes a mapping of <retention time, page number, P/E cycle value> (410) to one or more read threshold value (412). The aforementioned mapping may further include any other system parameter(s) (i.e., one or more parameters in addition to retention time, page number, P/E cycle value) that affects the read threshold (e.g., temperature, workload, etc.). In one embodiment of the technology, the retention time corresponds to the time that has elapsed between the writing of the data to a physical location in a solid-state storage module and the time that the data is being read from the same physical location in the solid-state storage module. The retention time may be expressed in units of time or may be expressed as a unitless value (e.g., when the birth time is expressed as a unitless value). In one embodiment of the technology, the P/E cycle value in <retention time, page number, P/E cycle value> may be expressed as a P/E cycle or a P/E cycle range.

In one embodiment of the technology, read threshold value(s) (412) correspond to voltages or a shift value, where the shift value corresponds to a voltage shift of a default read threshold value. Each of read threshold values may be expressed as a voltage or as a unitless number that corresponds to a voltage.

In one embodiment of the technology, the default read threshold value is specified by the manufacturer of the solid-state memory modules. Further, the granularity of the shift values may be specified by the shift value, where the shift value corresponds to a voltage shift of a corresponding default read threshold value.

In one embodiment of the technology, the read threshold values (including the default read threshold values) correspond to voltage values that are used to read data stored in solid-state storage modules. More specifically, in one embodiment of the technology, the logical value (e.g., 1 or 0 for memory cells that are SLCs or 00, 10, 11, 01 for memory cells that are MLCs) is determined by comparing the voltage in the memory cell to one or more read threshold values. The logical value stored in the memory cell may then be ascertained based on the results of the comparison. For example, in an SLC type memory cell, if a given voltage (V) is above a threshold value, then the logical value stored in the memory cell is "1", and if the voltage is below the threshold value, then the logical value stored in the memory cell is "0". In one embodiment of the technology, each page in the solid-state memory module may include between 8 kB-16 kB of data. Accordingly, the storage module controller typically obtains logical values from multiple memory cells in order to service a read request. The specific number of memory cells from which logical values must be obtained varies based upon the amount of data that is being requested (via the read request) and the type of memory cell (SLC, MLC, etc.).

In one embodiment of the technology, the read threshold value(s) (412) are ascertained by conducting experiments to determine how the read threshold values should be modified when at least one of the following variables is modified: retention time, P/E cycle value, and page number. The read threshold value(s) (412) is optimized in order to be able to successfully read data from a solid-state memory module. Specifically, for each combination of <retention time, P/E cycle value, page number> an optimal read threshold value is determined. The optimal read threshold value for a given <retention time, P/E cycle value, page number> is the read threshold value that results in the lowest bit error rate (BER) in data retrieved from a solid-state memory module for a given retention time of the data, P/E cycle value of the physical location on which the data is stored, and the page number of the page on which the data is stored in the solid-state memory module.

By modifying the read threshold value(s) based upon retention time, P/E cycle value, and page number, the storage appliance takes into account the various variables that may alter the voltage stored in a given memory cell at a given retention time, P/E cycle value, and page number. Said another way, when the logical value "1" is to be stored in a memory cell, the storage module controller stores a sufficient number of electrons in the memory cell in order to have a voltage that corresponds to "1". Over time, the voltage stored in the memory cell varies based upon the retention time, P/E cycle value, and page number. By understanding how the voltage varies over time based on the above variables, an appropriate read threshold value may be used when reading the logical value from the memory cell in order to retrieve "1".

For example, a first read threshold value(s) may be used to successfully read data when the retention time is 4 months, the P/E cycle value is 30,000, and the page number is 3, while a second read threshold value(s) may be used to successfully read data when the retention time is 5 months, the P/E cycle value is 30,000, and the page number is 3.

If the default read threshold value is used (instead of a non-default read threshold value), then there is a higher likelihood that an incorrect logical value (e.g., "0" instead of "1") may be obtained from reading the memory cell. This, in turn, results in the need for ECC or other error correction mechanisms such as RAID reconstruction (i.e., correction of errors within retrieved data using one or more parity values) in order to correct the error in the retrieve data and ultimately provide error-free data to the requesting client. The use of error correction mechanisms increases the time required to service a client read request and consequently decreases the performance of the storage appliance.

In one embodiment of the technology, a read threshold value(s) may be provided for each <retention time, P/E cycle value, and page number> combination. The specific read threshold value(s) for a given <retention time, P/E cycle value, and page number> may correspond to the default read threshold value(s) or a non-default read threshold value(s) (i.e., a read threshold value other than the default read threshold value(s)).

In another embodiment of the technology, memory (210 in FIG. 2) only stores a non-default read threshold value(s) for each <retention time, P/E cycle value, and page number> combination that is associated with a non-default read threshold value(s). In this scenario, a non-default read threshold value is associated with a given <retention time, P/E cycle value, and page number> combination when using the non-default read threshold value results in a higher percentage of error-free data being read from the solid-state memory module versus using the default read threshold value(s). Further, in this scenario, no default read threshold value(s) is stored for any <retention time, P/E cycle value, and page number> combination when using the default read threshold value(s) results in a higher percentage of error-free data being read from the solid-state memory module versus using the non-default read threshold value(s).

In one embodiment of the technology, the in-memory data structure includes mappings of <retry count, page number> (414) to sets of decoding parameters (416). The mapping may be based on any combination of system parameters. For example, a mapping may be established solely for <retry count>, or it may, additionally or alternatively, consider P/E cycle values and/or retention times, and/or page type and/or any other system parameter(s) (i.e., one or more parameters in addition to (or instead of) retry count and page number). For example, instead of <retry count, page number>, the following mappings may be used: <retry count, page type>, <retry count, retention time, page number>, or <retry count, retention time, page type>. Further, those skilled in the art will appreciate that while the discussion of the technology uses <retry count, page number>, the technology may be implemented using any of the following parameter sets <retry count, page type>, <retry count, retention time, page number>, or <retry count, retention time, page type>. In one embodiment of the technology, MLC memory has two page types: upper and lower and TLC memory has three page types: upper, middle, lower.

The above mapping enables the use of specific decoding parameters (416) for a particular combination of a retry count and a page number. For example, for a given page, a first decoding parameter set may be used for an initial read operation. If that read operations fails, a second read operation may be performed using a second decoding parameter set, as established by the above mapping. The above mapping may be established for any number of retry counts. A set of decoding parameters (416) may include a decoding mode (418) and a read threshold shift(s) (420).

In one embodiment of the technology, the decoding mode (418) determines the algorithm to be used for error detection and correction when reading data. The decoding algorithm may be based on an error correcting code (ECC) that operates on a series of bits obtained from performing a read operation and verifies the correctness of these bits (e.g., based on redundancies in the series of bits), and corrects bits that are detected as incorrect. A series of bits may be, for example, a four kilobyte code word, where the bits of the code word are obtained from memory cells. The decoding algorithm may be any kind of decoding algorithm, including Hamming, Reed-Solomon, Bose-Chaudhuri-Hocquenghem (BCH), and low-density parity check (LDPC) codes, without departing from the technology and/or any other hard or soft decoding algorithm as further described below. These decoding algorithms may operate on data obtained from multiple memory cells. These data may include redundancies that enable reconstruction of the data, even if one or more bits are corrupted.

In the above mapping, the specification of a decoding mode (418) may be used to request the use of particular decoding algorithm, depending on <retry count, page number> (or any of the other parameter sets described above). The decoding mode may, for example, specify a fast decoding algorithm for the initial read operation. This fast decoding algorithm may only cause a minimal delay but may be limited to the correction of relatively few errors only. For a subsequent read operation, when the initial read operation has failed, the decoding mode may specify a more powerful decoding algorithm that is capable to handle a larger number of errors. This decoding algorithm may, however, be computationally more complex and may, thus, have a longer execution time. In the above scenario, one would therefore not use this decoding algorithm for the initial read operation to avoid an unnecessary performance reduction. In another embodiment of the technology, when the retry is high (or higher), the same decoding mode may be used while varying the read threshold parameters and/or the decoding parameters. A fast decoding algorithm may be an algorithm that relies on hard read thresholds (or a smaller number of read operations) and smaller sets of input symbols to the decoding algorithm. The fast decoding method may be a non-probabilistic or it may be probabilistic if low-density parity check (LDPC) codes are used. While this algorithm is computationally efficient, it may only allow detection and correction of a limited number of bit errors. A less computationally efficient but more powerful decoding algorithm may rely on soft read thresholds (or a larger number of read operations) and a larger set of input symbols to the decoding algorithm. In such instances the decoding algorithm may be probabilistic. Further, an even more powerful decoding algorithm may be requiring additional read operations using additional read thresholds to perform more accurate probabilistic estimations. This algorithm may thus further reduce read performance due to the additional required read operations while enabling the decoding of data that would otherwise not be recoverable.

In one or more embodiments of the technology, the choice of decoding algorithm depending on the number of retries may enable the prolonged use of solid state memory. For example, to read from aging solid state memory, after an initial read operation has failed, the subsequent read operations may require a particularly powerful but computationally demanding decoding algorithm thus sacrificing performance while enabling successful decodes in the aging solid state memory. Alternatively, in another scenario in which the solid state memory is assumed to be in good condition, a read retry may be performed using the same computationally efficient decoding algorithm or a decoding algorithm that is only slightly more computationally demanding, thus only minimally reducing read performance.

The above mapping may further be used to specify a particular read threshold shift(s) (420), depending on <retry count, page number> (or any of the other parameter sets described above). The read threshold shift may offset the read threshold(s) from the originally specified read threshold value(s) (412). A read threshold shift may offset the originally specified read threshold in a direction that is considered advantageous. A zero read threshold offset may, for example, be used for the initial read operation (retry count=0). The zero read threshold offset results in the read operation being executed using the originally specified read threshold value(s) (412). For a subsequent read operation, when the initial read operation has failed (retry count=1), a non-zero read threshold shift(s) (420) may be applied. This non-zero read threshold shift(s) may result in the use of a read threshold value(s) higher or lower than the originally specified read threshold value(s) (412). The read threshold shift(s) may be selected in conjunction with the decoding mode (418). More specifically, the selection of a particular decoding algorithm, as specified by the decoding mode (418) may require a particular number and/or a particular location of the read threshold value(s).

In one embodiment of the technology, the decoding parameters (416) are ascertained by conducting experiments to determine how the decoding parameters should be modified when at least one of the following variables is modified: retry count and page number (or any of the other parameters or parameter sets described above). The decoding parameters (416) are optimized in order to be able to successfully read data from a solid-state memory module, given <retry count, page number> (or any of the other parameter sets described above). The optimal decoding parameters for a given <retry count, page number > (or any of the other parameter sets described above) are the decoding parameters for which it is likely that bits read from the memory cells can be correctly decoded. Further, the optimal decoding parameters may also maximize read performance. For example, rather than always using the decoding parameters that enable the most powerful but computationally demanding decoding algorithm, the optimal decoding parameters may be selected such that correct decoding is likely to be achieved using the most computationally efficient decoding algorithm suitable for the current decoding task.

Figure 5:
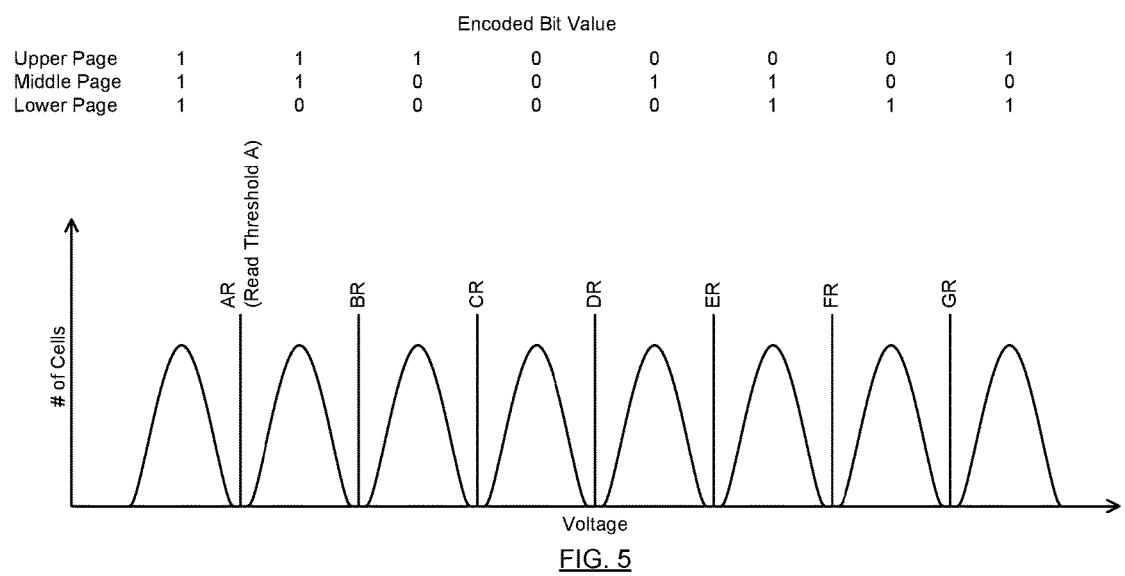
FIG. 5 shows voltage distributions of exemplary triple level cells (TLC) and read thresholds in accordance with one or more embodiments of the technology.

FIG. 5 shows voltage distributions of exemplary triple level cells (TLC) and read thresholds in accordance with one or more embodiments of the technology. Three bits are encoded by a set of eight voltage distributions, as shown. The encoded bit values displayed above the voltage distributions indicate the order in which the bits are encoded, in these exemplary triple level cells. Any other order may be used, without departing from the technology. FIG. 5 further shows seven read thresholds (AR-GR) that may be used to unambiguously read from the memory cells. Specifically, for example, if a voltage is found to be below voltage threshold AR, the obtained voltage may be unambiguously identified as encoding the bit value "111". Further, if for example, the obtained voltage is found to be between read thresholds CR and DR, the obtained voltage may be unambiguously identified as encoding the bit value "000". The unambiguous identification may be possible because none of the exemplary voltage distributions have any overlap. Those skilled in the art will appreciate that in real world memory cells, voltage distributions may have overlap, and further that voltage distributions may shift and/or change other characteristics such as their shape, e.g., based on the retention time and/or the number of encountered P/E cycles. In such cells, an unambiguous identification of a particular bit value may not be possible without the use of decoding algorithms such as ECC algorithms Depending on the severity of the degree overlap or other undesirable characteristics of the memory cells, even the decoding using the ECC algorithms may be unsuccessful. In such a situation, a read operation may have to be repeated, as subsequently described in FIGS. 6A-7B.

FIGS. 6A-6C show exemplary read retry tables for lower, middle and upper pages, respectively, of TLC solid state memory. All three read retry tables relate to the exemplary TLC type memory cells illustrated in FIG. 5. Separate read retry tables are established for lower, middle and upper pages because these pages have different read threshold requirements. Specifically, only two read thresholds are necessary to read the lower and upper pages, whereas three read thresholds are necessary to read the middle page. Consider, for example, the encoded bit values of the lower page, shown in FIG. 5. To distinguish a "0" from a "1" in the lower page, only read thresholds AR and ER are necessary because a cell voltage below the read threshold AR always indicates a "1", a cell voltage above the read threshold ER also always indicates a "1", whereas any cell voltage between read thresholds AR and ER always indicates a "0". Importantly, the above interpretation is only valid for ideal data, i.e., data whose corresponding voltages are in the proper range, and for memory cells where voltage distributions do not overlap. However, because data is not always ideally represented, as previously discussed, and because voltage distributions may overlap, read errors may occur when based on the use of these read thresholds. These read errors may then be corrected using, for example, ECC algorithms. However, if the ECC correction is unsuccessful, a read retry may become necessary. Such read retries, in accordance with an embodiment of the technology, are performed using different decoding parameters, including different read threshold shifts and/or different decoding modes. In the exemplary read retry tables of FIGS. 6A-6C, the read thresholds are individually modified by applying different read threshold shifts, depending on the retry count. A read threshold shift may be specified using any unit, e.g., volts, microvolts, any other increment, or it may be specified without units. Similarly, a different decoding mode may be specified, depending on the retry count. In the exemplary read retry tables of FIGS. 6A-6C, three decoding algorithms are distinguished. The decoding algorithm identified by decoding mode "0" may be, for example, a hard threshold ECC algorithm, the decoding algorithm identified by decoding mode "1" may be, for example, a soft threshold ECC algorithm that relies on one or two additional read operations per state boundary, and the decoding algorithm identified by decoding mode "2" may be, for example, a soft threshold ECC algorithm that requires three or four additional read operations per state boundary. Different read threshold shifts and decode modes may be specified for any number of read retries, until retry count has reached a maximum retry count number. Details regarding the use of read retry tables, in accordance with one or more embodiments of the technology, are subsequently provided with reference to FIGS. 7A and 7B.

Figure 6E:
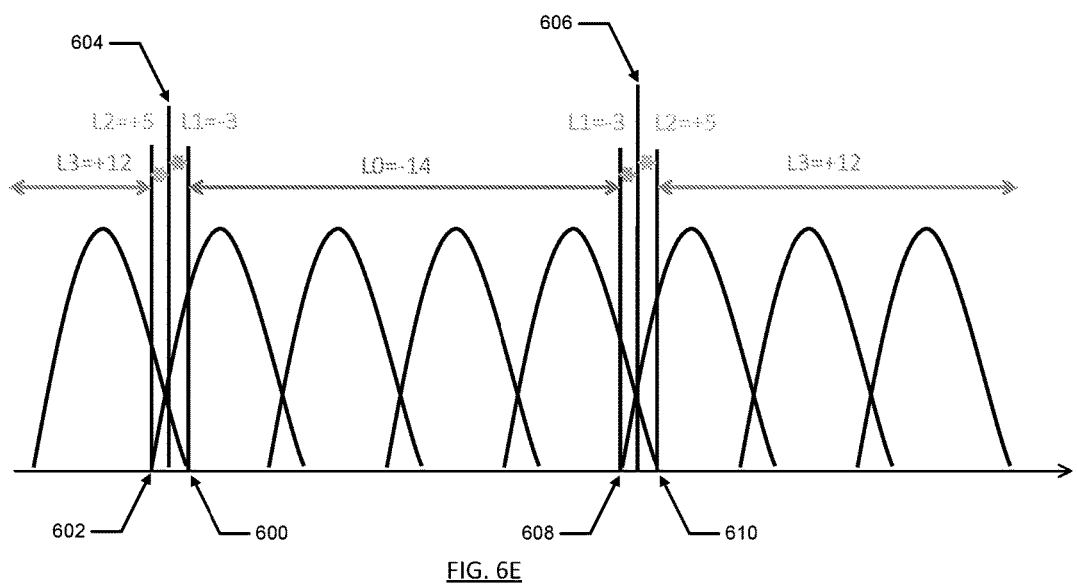
FIG. 6E shows the relationship between the voltage distribution of exemplary TLC and a case of systematic read retry table parameters.

FIG. 6D shows an exemplary secondary table for the systematic read retry of a lower page of TLC solid state memory and FIG. 6E shows the relationship between the voltage distribution of exemplary TLC and a case of systematic read retry table parameters.

Turning to FIGS. 6D and 6E, each page type may have one such secondary table. In the exemplary table shown in FIG. 6D, the first row, decoding mode 0, does not have any extra read points because it is hard threshold decoding. Decoding parameters are specified as L0 and L1 for the binary input symbol 1 and 0, respectively. Decoding mode 1 corresponds, for example, to a soft decoding with two additional read operations. The read point R0 and R1 are relative to the read thresholds specified in the primary retry table. For example, when the system performs retry count 5 for the lower page in FIG. 6A, the AR shift value (604) is +10, the ER value (606) is +2, and the decoding mode is 1. The decoding mode 1 for the lower page is defined in FIG. 6D. The extra read for AR is −7 (R0) and +8 (R1). As shown in FIG. 6E, the extra read locations are AR+R0=+10−7=+3 (602) and AR+R1=+10+8=+18 (600). Further, the extra read for ER is −6 (R4) and +7 (R5). As shown in FIG. 6E, the extra read locations are ER+R4=+2−6=−4 (608) and ER+R5=+2+7=+9 (610).

Continuing with the example, the decoding parameters L0, L1, L2, L3 are looked up from the secondary table by the decoding mode. The decoding parameter L3 is assigned to the cells whose voltage is below AR+R0. The decoding parameter L2 is assigned to the cells or bit locations whose voltage is between AR+R0 and AR. The decoding parameter L1 is assigned to the cells or bit locations whose voltage is between AR and AR+R1. The decoding parameter L0 is assigned to the cells or bit locations whose voltage is between AR+R1 and ER+R4. The decoding parameter L1 is assigned to the cells or bit locations whose voltage is between ER+R4 and ER. The decoding parameter L2 is assigned to the cells or bit locations whose voltage is between ER and ER+R5. The decoding parameter L3 is assigned to the cells or bit locations whose voltage is above ER+R5. Higher decoding modes such as decoding mode 3 shown in FIG. 6D may be defined by adding more extra read locations and adding more decoding parameters.

While FIGS. 5 and 6A-6E discuss read retries for exemplary TLC type memory cells, similar concepts are equally applicable to any other type of memory including MLC and SLC memory, without departing from the technology.

Turning to the flowcharts, while the various steps in the flowchart are presented and described sequentially, one of ordinary skill will appreciate that some or all of the Steps may be executed in different orders, may be combined or omitted, and some or all of the steps may be executed in parallel.

Figure 7A:
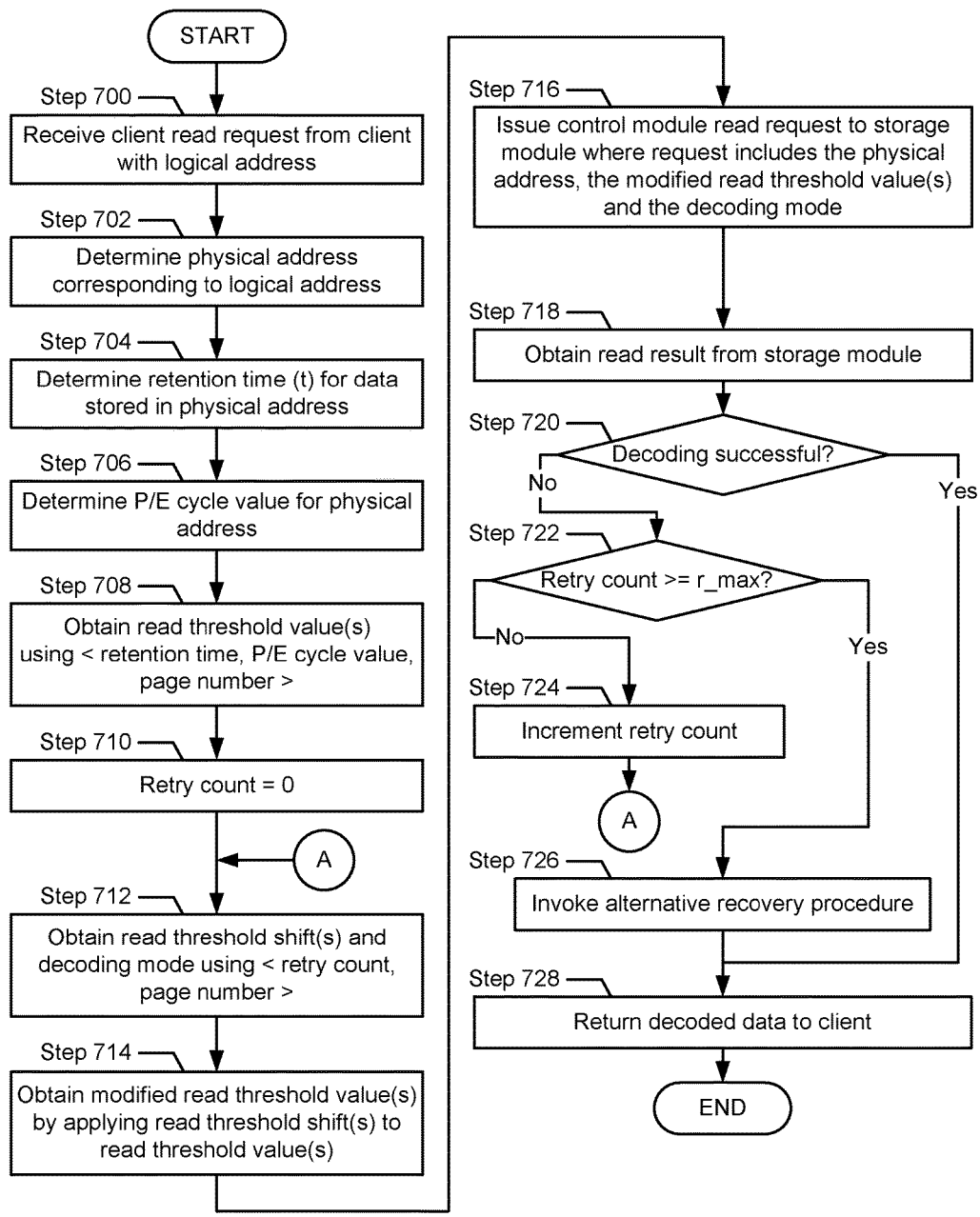
FIGS. 7A and 7B show methods for reading data from a storage module in accordance with one or more embodiments of the technology.

FIG. 7A shows a method for processing client read requests by a storage appliance in accordance with one or more embodiments of the technology. Prior to the execution of the method of FIG. 7A, a characterization of the solid state memory to be targeted by the read operation(s) has been performed. As a result of the characterization, read threshold values have been determined for the combinations of <retention time, page number, P/E cycle value>. Further, read threshold shifts and decoding modes have been determined for any number of retry counts or combinations of retry counts with other variables such as page numbers.

In Step 700, a client read request is received by the control module from a client, where the client read request includes a logical address.

In Step 702, a physical address (which includes the page number) is determined from the logical address. As discussed above, the memory in the control module includes a mapping of logical addresses to physical addresses (see discussion of FIG. 4, 400, 402). In one embodiment of the technology, the physical address is determined by performing a look-up (or query) using the mapping of logical addresses to physical addresses along with the logical address obtained from the client request in Step 600.

In Step 704, the retention time (t) is determined for the data stored at the physical address. The retention time may be determined using the birth time of the data (see FIG. 4, 408) and the time of the client request (e.g., the time the client issued the client request, the time the client request was received by the storage appliance, etc.). The birth time of the data is obtained from the memory (e.g., FIG. 2, 210) of the control module. The retention time may be calculated by determining the difference between the time of the client request and the birth time.

In Step 706, the P/E cycle value for the physical address is determined. The P/E cycle value may be determined by performing a look-up in an in-memory data structure (located in the memory of the control module) using the physical address as the key. The result of Step 506 may be the actual P/E cycle value associated with the physical address (e.g., the P/E cycle value associated with the block in which the physical location corresponding to the physical address is located) or may be a P/E cycle value range (e.g., 5,000-9,999 P/E cycles), where the actual P/E cycle value associated with the physical address is within the P/E cycle value range.

In Step 708, zero or more read threshold values to be used for the read operation are obtained from an in-memory data structure (see FIG. 4, 412) using the following key <retention time, P/E cycle value, and page number>. In one embodiment of the technology, in Step 708 no read threshold values, confidence levels and/or decoding schemes may be obtained when the default read threshold value(s), confidence levels and/or decoding scheme is to be used by the storage module controller to read data from the physical address. As discussed above, the default read threshold value(s), confidence levels and/or decoding schemes are used when they result in a higher read performance (e.g., a higher percentage of error-free data (i.e., data with no bit errors) and/or faster read operations) versus using the non-default read threshold value(s), confidence levels and/or decoding scheme. In one embodiment of the technology, non-default threshold values, confidence levels and/or decoding scheme (see FIG. 4, 412) may be obtained. As discussed above, the non-default read threshold value(s), confidence levels and/or decoding scheme are used when using them results in a better read performance (e.g., a higher percentage of error-free data (i.e., data with no bit errors) and/or faster read operations) versus using the default read threshold value(s), confidence levels and/or decoding scheme.

In one embodiment of the technology, the determination of whether to use a non-default read threshold value, confidence levels and/or a non-default decoding scheme may be based on the P/E cycle value (determined in Step 706) and/or the retention time (determined in Step 704). For example, when the P/E cycle value is below a threshold P/E cycle value, the default read threshold value(s), confidence levels and/or the default decoding scheme may be used, and Step 708 may thus be skipped. Additionally or alternatively, when the retention time is below a threshold retention time, the default read threshold value(s), confidence levels and/or the default decoding scheme may be used, and Step 708 may thus be skipped. When the P/E cycle value (determined in Step 706) is above the threshold P/E cycle value and/or the retention time (determined in Step 704) is above the threshold retention time then the look-up described in Step 608 may be performed.

In Step 710, the variable "retry count" is initialized to zero. Retry count will subsequently be used to track the number of repeated read attempts.

In Step 712, one or more read threshold shift(s) and the decoding mode are obtained from the in-memory data structure (see FIG. 4, 416) using the following key <retry count, page number> (or any of the other parameter sets described above). In one embodiment of the technology, the one or more read threshold shifts, the decoding mode (including the one or more additional threshold for one or more read requests) may be obtained using a primary and/or a secondary table as described above with respect to FIGS. 6A-6E.

Continuing with the discussion of FIG. 7A, in one embodiment of the technology, in Step 712 no read threshold shifts and/or decoding mode is/are obtained when the read threshold shifts are zero and/or when a default decoding mode is to be used by the storage module controller to read data from the physical address. As discussed above, read threshold shifts may be zero, for example, when the initial read operation (retry count=0) is performed.

In Step 714, a modified read threshold value(s) is obtained by applying the read threshold shift(s) to the read threshold value(s) obtained in Step 708. Positive read threshold shifts are added, whereas negative read threshold shifts are subtracted.

In Step 716, a control module read request is generated using the one or more modified read threshold value(s), the decoding mode, and the physical address. If there are no read threshold values obtained in Step 708 and/or no read threshold shifts are applied in Step 712, and/or no decoding mode was obtained in Step 712, the control module request may (i) include no read threshold values, and/or decoding mode, or (ii) may include one or more default read threshold values and/or decoding mode, where the control module obtains the default read threshold values and/or the default decoding mode in response to no read threshold values and/or decoding mode having been obtained in Step 708 and/or Step 712. The format of the control module read request may be any format that is supported by the storage module controller.

Figure 7B:
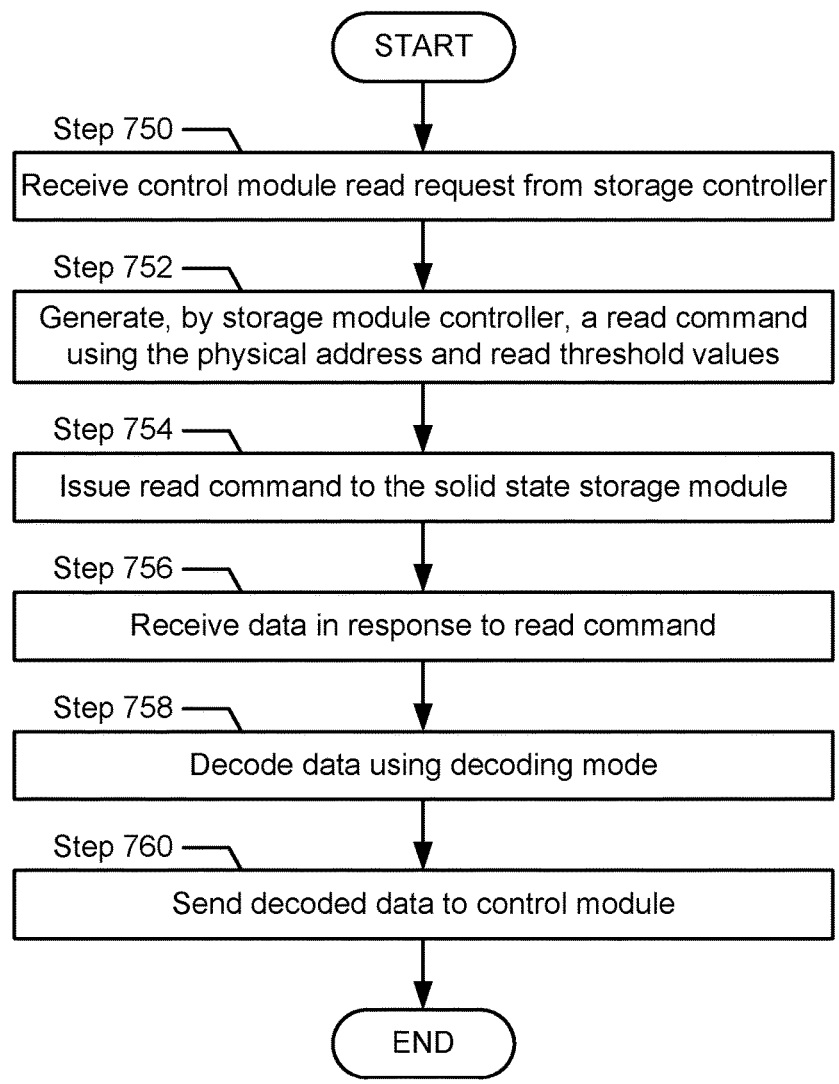

After completion of Step 716, the storage module may process the read request as described in FIG. 7B. Once the storage module has completed the method of FIG. 7B, it may return a read result, which is received by the control module in Step 718.

In Step 720, a determination is made about whether the decoding of data by the storage module, as further described in FIG. 7B, was successful. The determination may be made based on characteristics of the data being returned by the storage module in Step 718. For example, an empty returned data set or a data set that includes a specific data pattern may indicate a failed decode, whereas any other returned data may be accepted as successfully decoded. If a determination is made that the decoding was successful, the method may directly proceed to Step 728. However, if it is determined that the decoding was unsuccessful, the method may proceed to Step 722.

In Step 722, a determination is made about whether the number of read retries has reached or exceeds a maximum number of allowable read retries. If the number of read retries has not yet reached the maximum number of allowable read retries, the method may proceed to Step 724, in which the variable "retry count" is incremented. Subsequently the method may return to Step 712.

Returning to Step 722, if the number of read retries has reached or exceeds the maximum number of allowable read retries, the method may proceed to Step 726, in which an alternative recovery procedure is invoked. This alternative recovery procedure may involve, for example, the reconstruction of the data using RAID methods, which may enable reconstruction of the data using redundancies implemented across the storage media, e.g., across multiple different memory modules.

In Step 728, the decoded data that was obtained either by a successful decode as described in FIG. 7B, or by a RAID operation in Step 728, is returned to the requesting client.

FIG. 7B shows a method for processing control module read requests in accordance with one or more embodiments of the technology. More specifically, FIG. 7B is performed by the storage module controller.

In Step 750, the control module read request is received from the control module. In Step 752, a read command is generated by the storage controller module based on the one or more read threshold value(s) in the control module read request. In one embodiment of the technology any given read command generated in Step 752 may specify one or more read threshold values. If the control module read request does not include any read threshold values, then the default read threshold values are used to generate the read command. The read command may be in any format that is supported by the solid-state memory modules.

In Step 754, the read command is issued to the solid-state memory module.

In Step 756, the data are received, by the storage module controller, in response to the read command. In Step 758, the data received in Step 756 are decoded. The decoding may be performed using the decoding algorithm identified by the decoding mode specified in the control module read request received in Step 750. The decoding algorithm may operate on all data received in Step 756. If, for example, three data sets are received from the same memory cells that were read three times using different read thresholds, all three data sets may be processed by the decoding algorithm to obtain the decoded data. Obtaining the decoded data may involve using redundancies in the data to check for erroneous bits, and a correction of the erroneous bits, if detected, as previously described. A decode may be successful or unsuccessful, for example, if the frequency of errors in the data is high.

In Step 760, the decoded data are provided to the control module. The control module. If the decode was unsuccessful, no data or a data pattern that indicates a failed decode may be returned.

Figure 8:
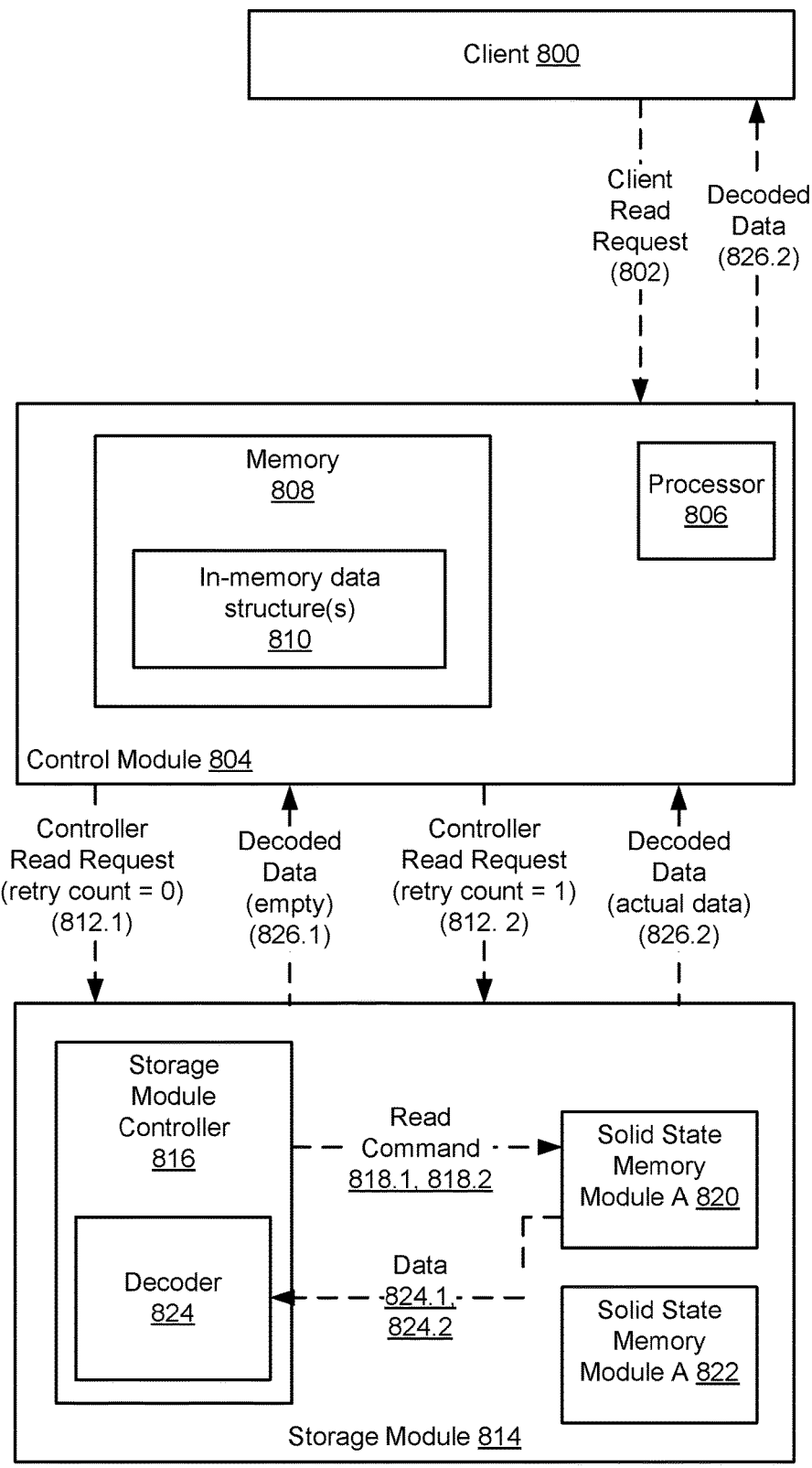
FIG. 8 shows an example in accordance with one or more embodiments of the technology.

FIG. 8 shows and example in accordance with one or more embodiments of the technology. The following example is not intended to limit the scope of the technology.

Turning to FIG. 8, consider a scenario in which a client (800) issues a client read request (802), which includes a logical address, to a storage appliance that includes a control module (804) and at least one storage module (814). The control module (804) receives the client read request and generates a controller read request (812) using the method described in FIG. 7A using the processor (806) and one or more in-memory data structures (810) stored in the memory (808) on the control module. More specifically, the control module, using one or more in-memory data structures (810), determines the physical address (PA) that corresponds to the logical address. Further, the control module, using one or more in-memory data structures (810) and the physical address, determines the birth time of the data stored at the physical address. The control module subsequently uses the birth time and the time that the client read request was received in order to determine the retention time of the data stored at the physical address. The control module then performs a look-up in an in-memory data structure(s) using the following index: <retention time, P/E cycle value, page number> in order to obtain at least one read threshold value, where the P/E cycle value is obtained from one of the in-memory data structures and the page number is extracted from the physical address. Further, a look-up is performed in the in-memory data structure(s) to obtain a read threshold shift and a decoding mode for the initial read operation (retry count=0).

In this example assume that the solid-state memory module (820, 822) includes SLCs and that the aforementioned look-up returns a single read threshold value, a decoding mode "0" and a read threshold shift "0". The control module (804) subsequently generates a controller read request that includes the physical address, the read threshold value and the decoding mode. The controller read request (812.1) is subsequently issued to the storage module (814) that includes a solid-state memory module (820, 822) that includes the physical location corresponding to the physical address.

The storage module controller (816) subsequently receives and services the controller read request (812.2). More specifically, the storage module controller (816) generates and issues a read command (818.1) to the solid-state memory module that includes the physical location corresponding to the physical address.

The decoder (824), executing the decoding scheme, subsequently receives the data (824.1) from the solid-state memory module. The decoder applies the decoding algorithm identified by decoding mode "0" to the received data (824.1). In the example, assume that the decoding fails due to a significant number of erroneous bits in the data (824.1). The decoder (824) therefore returns an empty data set as the decoded data (826.1) to the control module (804).

In response to the detected failed decode, the control module increments the variable "retry count". Next, a look-up is performed in the in-memory data structure(s) to obtain a read threshold shift and a decoding mode for the repetition of the read operation (retry count=1). A non-zero read threshold shift and a decoding mode "1" are obtained. The read threshold shift is applied to the read threshold value, and the control module (804) subsequently generates a controller read request that includes the physical address, the modified read threshold value and the decoding mode. The controller read request (812.2) is subsequently issued to the storage module (814).

The storage module controller (816) subsequently receives and services the controller read request (812.2). More specifically, the storage module controller (816) generates and issues a read command (818.2) to the solid-state memory module that includes the physical location corresponding to the physical address.

The decoder (824), executing the decoding scheme, subsequently receives the data (824.2) from the solid-state memory module. The decoder applies the decoding algorithm identified by decoding mode "1" to the received data (824.2). The decoding succeeds and the decoder (824) returns the decoded data (826.2) to the control module (804). Subsequently, the decoded data is returned to the client (800).

While the exemplary system of FIG. 8 requires repeated exchanges (812.1, 826.1, 812.2, 826.2) between the control module (804) and the storage module (814) in order to perform read retries, in an alternative embodiment of the technology, the storage module (814) may autonomously perform multiple read and decode operations, e.g., until a successful decode is obtained. More specifically, in one embodiment of the invention, read threshold shifts and decoding modes for multiple read retries are locally stored in the storage module controller (816) or in an affiliated memory, thus enabling the storage module controller (816) to issue an additional read command after an unsuccessful decode, without having to obtain a read threshold shift and a decoding mode from the control module (804). Alternatively, a read request issued by the control module (804) may include multiple read thresholds and decode modes for multiple read retries. The storage module controller (816) may, thus, autonomously perform multiple read retries and may only need to communicate with the control module (804) if none of the read retries have been successful, thus requiring additional read thresholds and decode modes for additional read retries.

One or more embodiments of the technology may be implemented using instructions executed by one or more processors in the storage appliance. Further, such instructions may correspond to computer readable instructions that are stored on one or more non-transitory computer readable mediums.

While the technology has been described with respect to a limited number of embodiments, those skilled in the art, having benefit of this disclosure, will appreciate that other embodiments can be devised which do not depart from the scope of the technology as disclosed herein. Accordingly, the scope of the technology should be limited only by the attached claims.

What is claimed is:

1. A method for reading and decoding data from solid state memory, the method comprising:
receiving a client read request for data from a client, wherein the client read request comprises an address;
determining a page number for a physical page identified by the address;
obtaining a read threshold value using the page number;
obtaining a first read threshold shift and a first decoding mode for an initial read in the page identified by the page number;
obtaining a first modified read threshold value by applying the first read threshold shift to the read threshold value;
issuing a first control module read request comprising the first modified read threshold value and the decoding mode to a storage module, wherein the storage module comprises the physical page;
obtaining first data by decoding data bits obtained from the physical page using the first modified read threshold value and the first decoding mode;
making a first determination, that the obtaining the first data has failed, and based on the determination:
obtaining a second read threshold shift and a second decoding mode for a first read retry in the physical page;
obtaining a second modified read threshold value by applying the second read threshold shift to the read threshold value;
issuing a second control module read request comprising the second modified read threshold value and the second decoding mode to the storage module;
obtaining second data by decoding data bits obtained from the physical page using the second modified read threshold value and the second decoding mode; and
making a second determination, that the obtaining the second data was successful, and based on the determination:
returning the second data to the requesting client.

2. The method of claim 1, further comprising:
receiving a second client read request for data from the client, wherein the client read request comprises a second address;
determining a second page number for a second physical page identified by the second address;
obtaining a second read threshold value using the second page number;
obtaining a third read threshold shift and a third decoding mode for an initial read in the physical page identified by the second page number;
obtaining a third modified read threshold value by applying the third read threshold shift to the second read threshold value;
issuing a third control module read request comprising the third modified read threshold value and the third decoding mode to the storage module, wherein the storage module comprises the second physical page;
obtaining third data by decoding data bits obtained from the physical page using the third modified read threshold value and the third decoding mode;
making a third determination, that the obtaining the third data has failed, and based on the determination:
obtaining a fourth read threshold shift and a fourth decoding mode for a first read retry in the second physical page;
obtaining a fourth modified read threshold value by applying the fourth read threshold shift to the second read threshold value;
issuing a fourth control module read request comprising the fourth modified read threshold value and the fourth decoding mode to the storage module;
obtaining fourth data by decoding data bits obtained from the physical page using the fourth modified read threshold value and the fourth decoding mode; and
making a fourth determination, that the obtaining the fourth data has failed, and based on the determination:
reconstructing the fourth data using a RAID mechanism, and
returning the fourth data to the requesting client.

3. The method of claim 1, wherein obtaining the read threshold value further comprises using a retention time for the data and a program/erase (P/E) cycle value associated with the physical page,
wherein the retention time is determined using the address.

4. The method of claim 1, wherein the first determination is made based on a detection that the first data comprises entries that indicate unsuccessful decoding.

5. The method of claim 1, wherein the data bits obtained from the physical page using the first modified read threshold value comprise bit errors that are not correctable using the first decoding mode.

6. The method of claim 1, wherein obtaining the first read threshold shift, and the first decoding mode for the initial read and obtaining the second read threshold shift and the second decoding mode for the first read retry comprises:
performing a look-up in an in-memory data structure, wherein the in-memory data structure comprises a plurality of entries, wherein each of the plurality of entries comprises one of a plurality of read threshold shifts, one of a plurality of decoding modes, one of a plurality of page numbers and one of a plurality of retry counts.

7. The method of claim 6,
wherein the entries are organized in the order of retry counts, and
wherein for increasingly higher retry count numbers the associated decoding modes identify increasingly computationally demanding decoding algorithms.

8. The method of claim 6,
wherein the entries are organized in the order of retry counts, and
wherein for increasingly higher retry count numbers the associated read threshold shifts increase in magnitude.

9. The method of claim 6, further comprising, prior to receiving the client read request:
characterizing the solid state memory to establish a relationship between page numbers, retry counts, read threshold shifts and decoding modes; and
storing the relationship in an in-memory data structure.

10. The method of claim 1, wherein the first and the second decoding mode are selected from a group consisting of a hard threshold decoder, a soft threshold decoder using a single read operation per memory cell and a soft threshold decoder using a plurality of read operations per memory cell.

11. The method of claim 10, wherein the memory cell is one selected from a group consisting of a single-level cell (SLC), a multi-level cell (MLC) and a triple-level cell (TLC).

12. A system, comprising:
a storage module comprising a storage module controller and persistent storage; and
a control module operatively connected to the storage module and a client,
wherein the control module:
receives a client read request for data from a client, wherein the client read request comprises an address;
determines a page number for a physical page identified by the address;
obtains a read threshold value using the page number;
obtains a first read threshold shift and a first decoding mode for an initial read in the page identified by the page number;
obtains a first modified read threshold value by applying the first read threshold shift to the read threshold value;
issues a first control module read request comprising the first modified read threshold value and the decoding mode to a storage module, wherein the storage module comprises the physical page,
wherein the storage module:
receives the first control module read request;
obtains first data by decoding data bits obtained from the physical page using the first modified read threshold value and the first decoding mode; and
provides the first data to the control module,
wherein the control module further:
receives the first data;
makes a first determination, that the obtaining the first data has failed, and based on the determination:
obtains a second read threshold shift and a second decoding mode for a first read retry in the physical page;
obtains a second modified read threshold value by applying the second read threshold shift to the read threshold value; and
issues a second control module read request comprising the second modified read threshold value and the second decoding mode to the storage module,
wherein the storage module further:
receives the second control module read request;
obtains second data by decoding data bits obtained from the physical page using the second modified read threshold value and the second decoding mode; and
provides the second data to the control module,
wherein the control module further:
receives the second data;
makes a second determination, that the obtaining the second data was successful, and based on the determination:
returns the second data to the requesting client.

13. The system of claim 12,
wherein the control module further:
receives a second client read request for data from the client, wherein the client read request comprises a second address;
determines a second page number for a second physical page identified by the second address;
obtains a second read threshold value using the second page number;
obtains a third read threshold shift and a third decoding mode for an initial read in the physical page identified by the second page number;
obtains a third modified read threshold value by applying the third read threshold shift to the second read threshold value;
issues a third control module read request comprising the third modified read threshold value and the third decoding mode to the storage module, wherein the storage module comprises the second physical page,
wherein the storage module further:
receives the third control module read request;
obtains third data by decoding data bits obtained from the physical page using the third modified read threshold value and the third decoding mode; and
provides the third data to the control module,
wherein the control module further:
receives the third data;
makes a third determination, that the obtaining the third data has failed, and based on the determination:
obtains a fourth read threshold shift and a fourth decoding mode for a first read retry in the second physical page;
obtains a fourth modified read threshold value by applying the fourth read threshold shift to the second read threshold value;
issues a fourth control module read request comprising the fourth modified read threshold value and the fourth decoding mode to the storage module,
wherein the storage module further:
receives the fourth control module read request;
obtains fourth data by decoding data bits obtained from the physical page using the fourth modified read threshold value and the fourth decoding mode; and
makes a fourth determination, that the obtaining the fourth data has failed, and based on the determination:
reconstructs the fourth data using a RAID mechanism, and
returns the fourth data to the requesting client.

14. The system of claim 12 wherein the data bits obtained from the physical page using the first modified read threshold value comprise bit errors that are not correctable using the first decoding mode.

15. The system of claim 12, wherein obtaining the first read threshold shift, and the first decoding mode for the initial read and obtaining the second read threshold shift and the second decoding mode for the first read retry comprises:
performing a look-up in an in-memory data structure, wherein the in-memory data structure comprises a plurality of entries, wherein each of the plurality of entries comprises one of a plurality of read threshold shifts, one of a plurality of decoding modes, one of a plurality of page numbers and one of a plurality of retry counts.

16. The system of claim 15,
wherein the entries are organized in the order of retry counts, and wherein for increasingly higher retry count numbers the associated decoding modes identify increasingly computationally demanding decoding algorithms.

17. The system of claim 15,
wherein the entries are organized in the order of retry counts, and
wherein for increasingly higher retry count numbers the associated read threshold shifts increase in magnitude.

18. The system of claim 15, further comprising, prior to receiving the client read request:
characterizing the solid state memory to establish a relationship between page numbers, retry counts, read threshold shifts and decoding modes; and
storing the relationship in an in-memory data structure.

19. The system of claim 12, wherein the first and the second decoding mode are selected from a group consisting of a hard threshold decoder, a soft threshold decoder using a single read operation per memory cell and a soft threshold decoder using a plurality of read operations per memory cell.

20. A non-transitory computer readable medium comprising computer readable program code, which when executed by a computer processor enables the computer processor to:
receive a client read request for data from a client, wherein the client read request comprises an address;
determine a page number for a physical page identified by the address;
obtain a read threshold value using the page number;
obtain a first read threshold shift and a first decoding mode for an initial read in the page identified by the page number;
obtain a first modified read threshold value by applying the first read threshold shift to the read threshold value;
issue a first control module read request comprising the first modified read threshold value and the decoding mode to a storage module, wherein the storage module comprises the physical page;
obtain first data by decoding data bits obtained from the physical page using the first modified read threshold value and the first decoding mode;
make a first determination, that the obtaining the first data has failed, and based on the determination:
obtain a second read threshold shift and a second decoding mode for a first read retry in the physical page;
obtain a second modified read threshold value by applying the second read threshold shift to the read threshold value;
issue a second control module read request comprising the second modified read threshold value and the second decoding mode to the storage module;
obtain second data by decoding data bits obtained from the physical page using the second modified read threshold value and the second decoding mode; and
make a second determination, that the obtaining the second data was successful, and based on the determination:
return the second data to the requesting client.

* * * * *